(12) United States Patent
Chang et al.

(10) Patent No.: US 8,851,904 B2
(45) Date of Patent: Oct. 7, 2014

(54) SHIELDING SOCKET WITH TWO PIECES HOUSING COMPONENTS

(71) Applicants: Yen-Chih Chang, New Taipei (TW); Ke-Hao Chen, New Taipei (TW)

(72) Inventors: Yen-Chih Chang, New Taipei (TW); Ke-Hao Chen, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 66 days.

(21) Appl. No.: 13/753,545

(22) Filed: Jan. 30, 2013

(65) Prior Publication Data

US 2014/0038438 A1 Feb. 6, 2014

(51) Int. Cl.
*H01R 12/00* (2006.01)
*H01R 12/71* (2011.01)
*H01R 13/6599* (2011.01)
*H05K 7/10* (2006.01)

(52) U.S. Cl.
CPC .............. *H01R 12/71* (2013.01); *H01R 12/716* (2013.01); *H01R 13/6599* (2013.01); *H05K 7/10* (2013.01)
USPC ....................................... 439/71; 439/607.03

(58) Field of Classification Search
CPC ... H01R 12/52; H01R 13/2442; H05K 7/1069
USPC ................................. 439/66, 70, 71
See application file for complete search history.

(56) References Cited

U.S. PATENT DOCUMENTS

| | | | | |
|---|---|---|---|---|
| 6,572,397 B2 * | 6/2003 | Ju | ................................ | 439/342 |
| 6,652,329 B1 * | 11/2003 | Howell et al. | ................. | 439/862 |
| 6,695,624 B1 * | 2/2004 | Szu | ................................ | 439/66 |
| 6,731,516 B1 * | 5/2004 | Ma | ................................ | 361/802 |
| 6,793,504 B2 * | 9/2004 | Noda et al. | ....................... | 439/71 |
| 6,877,998 B1 * | 4/2005 | Kim et al. | ....................... | 439/108 |
| 6,884,087 B2 * | 4/2005 | Searls et al. | ..................... | 439/66 |
| 6,905,377 B2 * | 6/2005 | Murr | ............................. | 439/862 |
| 6,957,987 B2 * | 10/2005 | Ma et al. | .................... | 439/733.1 |
| 6,976,888 B2 * | 12/2005 | Shirai et al. | .................... | 439/862 |
| 7,008,237 B1 * | 3/2006 | Ma et al. | ........................ | 439/66 |
| 7,059,873 B2 * | 6/2006 | Johnescu et al. | ................ | 439/83 |
| 7,074,048 B2 * | 7/2006 | Liao et al. | ........................ | 439/66 |
| 7,083,429 B2 * | 8/2006 | Hashimoto et al. | ............ | 439/71 |
| 7,094,062 B2 * | 8/2006 | Ramey et al. | ................... | 439/66 |
| 7,097,517 B2 * | 8/2006 | Ma | ............................ | 439/733.1 |
| 7,104,827 B1 * | 9/2006 | Huang | ........................... | 439/331 |
| 7,125,259 B2 * | 10/2006 | Hashimoto | ...................... | 439/73 |
| 7,128,622 B2 * | 10/2006 | Tsai | .............................. | 439/874 |
| 7,147,489 B1 * | 12/2006 | Lin | ............................... | 439/83 |
| 7,186,152 B2 * | 3/2007 | Chen | ......................... | 439/733.1 |
| 7,198,493 B2 * | 4/2007 | Chen et al. | ..................... | 439/66 |

(Continued)

FOREIGN PATENT DOCUMENTS

| | | |
|---|---|---|
| CN | 202034567 | 11/2011 |
| TW | M419248 | 12/2011 |

*Primary Examiner* — Ross Gushi
(74) *Attorney, Agent, or Firm* — Wei Te Chung; Ming Chieh Chang

(57) ABSTRACT

An electrical connector for electrically connecting a chip module with a printed circuit board includes an insulative housing and a number of contacts fixed in the insulative housing. The insulative housing includes an upper component and a lower component cooperated with the upper component. The upper component has a protruding portion and the lower component has a hole cooperated with the protruding portion. The protruding portion is in touch with the hole and the contacting area is plated with a metal fillings. It is easy to assemble and it has better shielding effects.

20 Claims, 7 Drawing Sheets

(56) References Cited

U.S. PATENT DOCUMENTS

| | | | | |
|---|---|---|---|---|
| 7,214,069 B2* | 5/2007 | Rathburn | | 439/66 |
| 7,247,062 B1* | 7/2007 | Polnyi et al. | | 439/862 |
| 7,264,486 B2* | 9/2007 | Ma | | 439/83 |
| 7,278,864 B2* | 10/2007 | Tsai | | 439/83 |
| 7,291,021 B2* | 11/2007 | Shirai et al. | | 439/71 |
| 7,297,010 B2* | 11/2007 | Tsai | | 439/331 |
| 7,322,829 B2* | 1/2008 | Ma | | 439/66 |
| 7,322,830 B2* | 1/2008 | Szu | | 439/66 |
| 7,367,814 B2* | 5/2008 | Liao | | 439/71 |
| 7,371,075 B2* | 5/2008 | Liao et al. | | 439/71 |
| 7,377,792 B2* | 5/2008 | Ma | | 439/71 |
| 7,422,447 B2* | 9/2008 | Daily et al. | | 439/83 |
| 7,429,179 B2* | 9/2008 | Ma | | 439/83 |
| 7,429,200 B2* | 9/2008 | Lee et al. | | 439/862 |
| 7,445,461 B1* | 11/2008 | Polnyi | | 439/66 |
| 7,445,464 B2* | 11/2008 | Ma et al. | | 439/71 |
| 7,503,815 B2* | 3/2009 | Hsieh | | 439/862 |
| 7,527,536 B2* | 5/2009 | Chiang | | 439/884 |
| 7,556,505 B2* | 7/2009 | Deng et al. | | 439/70 |
| 7,563,105 B2* | 7/2009 | Liu et al. | | 439/66 |
| 7,563,107 B2* | 7/2009 | Liao et al. | | 439/71 |
| 7,575,440 B1* | 8/2009 | Polnyi | | 439/71 |
| 7,578,675 B2* | 8/2009 | Polnyi et al. | | 439/66 |
| 7,628,661 B2* | 12/2009 | Liao | | 439/862 |
| 7,632,105 B2* | 12/2009 | Yan | | 439/66 |
| 7,695,288 B2* | 4/2010 | Ma et al. | | 439/70 |
| 7,791,443 B1* | 9/2010 | Ju | | 336/107 |
| 7,828,558 B2* | 11/2010 | Ma | | 439/66 |
| 7,841,859 B2* | 11/2010 | Liao et al. | | 439/65 |
| 7,878,823 B2* | 2/2011 | Fan | | 439/83 |
| 7,878,870 B2* | 2/2011 | Fan | | 439/862 |
| 7,909,617 B2* | 3/2011 | Liao et al. | | 439/71 |
| 7,909,621 B1* | 3/2011 | Terhune, IV | | 439/83 |
| 7,922,548 B2* | 4/2011 | Fan | | 439/862 |
| 7,959,466 B2* | 6/2011 | Ju | | 439/607.03 |
| 7,988,501 B2* | 8/2011 | Chang | | 439/751 |
| 8,033,834 B2* | 10/2011 | Polnyi et al. | | 439/66 |
| 8,079,851 B1* | 12/2011 | Ma | | 439/83 |
| 8,079,872 B2* | 12/2011 | Ju | | 439/607.03 |
| 8,096,836 B2* | 1/2012 | Cheng et al. | | 439/626 |
| 8,118,603 B2* | 2/2012 | Ho | | 439/70 |
| 8,118,604 B2* | 2/2012 | Ma | | 439/70 |
| 8,123,574 B2* | 2/2012 | Ma | | 439/862 |
| 8,147,256 B2* | 4/2012 | Jin | | 439/83 |
| 8,187,009 B2* | 5/2012 | Liao et al. | | 439/83 |
| 8,192,206 B1* | 6/2012 | Ju | | 439/66 |
| 8,215,998 B1* | 7/2012 | Ju et al. | | 439/660 |
| 8,235,734 B2* | 8/2012 | Ju | | 439/83 |
| 8,277,230 B2* | 10/2012 | Huo et al. | | 439/66 |
| 8,287,288 B2* | 10/2012 | Chang et al. | | 439/626 |
| 8,323,038 B2* | 12/2012 | Jin | | 439/83 |
| 8,360,790 B2* | 1/2013 | Ju | | 439/83 |
| 8,366,453 B2* | 2/2013 | Chang et al. | | 439/70 |
| 8,454,373 B2* | 6/2013 | Cheng et al. | | 439/66 |
| 8,491,337 B2* | 7/2013 | Cai | | 439/607.28 |
| 8,535,093 B1* | 9/2013 | Mason | | 439/607.05 |
| 8,608,491 B2* | 12/2013 | Hsu | | 439/83 |
| 8,684,775 B2* | 4/2014 | Liu et al. | | 439/862 |
| 8,708,716 B1* | 4/2014 | Ho | | 439/83 |
| 2002/0111052 A1* | 8/2002 | Noda et al. | | 439/71 |
| 2003/0114029 A1* | 6/2003 | Lee et al. | | 439/83 |
| 2003/0166347 A1* | 9/2003 | Noda et al. | | 439/71 |
| 2003/0228809 A1* | 12/2003 | Howell et al. | | 439/862 |
| 2004/0067665 A1* | 4/2004 | Nakano | | 439/70 |
| 2004/0192081 A1* | 9/2004 | Koopman et al. | | 439/66 |
| 2004/0209492 A1* | 10/2004 | Kajinuma et al. | | 439/71 |
| 2004/0242057 A1* | 12/2004 | DeFord | | 439/526 |
| 2004/0253847 A1* | 12/2004 | Ma | | 439/66 |
| 2004/0266227 A1* | 12/2004 | Ma | | 439/71 |
| 2005/0003684 A1* | 1/2005 | Huang | | 439/71 |
| 2005/0020098 A1* | 1/2005 | Ramey et al. | | 439/66 |
| 2005/0020101 A1* | 1/2005 | Deng | | 439/71 |
| 2005/0034890 A1* | 2/2005 | Ju | | 174/94 R |
| 2005/0042940 A1* | 2/2005 | Liao | | 439/862 |
| 2005/0045363 A1* | 3/2005 | Ju | | 174/94 R |
| 2005/0054218 A1* | 3/2005 | Liao et al. | | 439/66 |
| 2005/0124187 A1* | 6/2005 | Olson et al. | | 439/71 |
| 2005/0124189 A1* | 6/2005 | Johnescu et al. | | 439/86 |
| 2005/0231902 A1* | 10/2005 | Huang | | 361/683 |
| 2005/0245106 A1* | 11/2005 | Ma | | 439/66 |
| 2005/0272295 A1* | 12/2005 | McHugh et al. | | 439/330 |
| 2005/0287836 A1* | 12/2005 | Ju | | 439/71 |
| 2006/0040518 A1* | 2/2006 | Ma et al. | | 439/66 |
| 2006/0094263 A1* | 5/2006 | Chen et al. | | 439/66 |
| 2006/0094308 A1* | 5/2006 | Chen | | 439/884 |
| 2006/0105609 A1* | 5/2006 | Huang et al. | | 439/331 |
| 2006/0148283 A1* | 7/2006 | Minich et al. | | 439/70 |
| 2006/0178031 A1* | 8/2006 | Lai | | 439/331 |
| 2006/0292935 A1* | 12/2006 | Ma | | 439/752.5 |
| 2007/0015376 A1* | 1/2007 | Szu | | 439/66 |
| 2007/0015377 A1* | 1/2007 | Lee et al. | | 439/66 |
| 2007/0087625 A1* | 4/2007 | Ma | | 439/570 |
| 2007/0148998 A1* | 6/2007 | Liao et al. | | 439/66 |
| 2007/0173138 A1* | 7/2007 | Lin et al. | | 439/884 |
| 2007/0202715 A1* | 8/2007 | Daily et al. | | 439/71 |
| 2007/0218718 A1* | 9/2007 | Ma | | 439/83 |
| 2007/0281507 A1* | 12/2007 | Liao et al. | | 439/71 |
| 2007/0281527 A1* | 12/2007 | Ma et al. | | 439/259 |
| 2008/0007923 A1* | 1/2008 | Hsieh | | 361/728 |
| 2008/0057749 A1* | 3/2008 | Liao et al. | | 439/69 |
| 2008/0081490 A1* | 4/2008 | Hsieh | | 439/71 |
| 2008/0113544 A1* | 5/2008 | Ho | | 439/342 |
| 2008/0119063 A1* | 5/2008 | Yan | | 439/66 |
| 2008/0124957 A1* | 5/2008 | Liao et al. | | 439/83 |
| 2008/0139027 A1* | 6/2008 | Trobough | | 439/267 |
| 2008/0160801 A1* | 7/2008 | Gattuso et al. | | 439/83 |
| 2008/0160842 A1* | 7/2008 | Polnyi et al. | | 439/862 |
| 2008/0160844 A1* | 7/2008 | Chiang | | 439/884 |
| 2008/0182453 A1* | 7/2008 | Ju | | 439/608 |
| 2009/0047817 A1* | 2/2009 | Liu et al. | | 439/296 |
| 2009/0111325 A1* | 4/2009 | Ju | | 439/607.55 |
| 2009/0156021 A1* | 6/2009 | Polnyi et al. | | 439/66 |
| 2009/0247023 A1* | 10/2009 | Liao | | 439/862 |
| 2009/0263985 A1* | 10/2009 | Liu et al. | | 439/66 |
| 2009/0311900 A1* | 12/2009 | Liao | | 439/331 |
| 2010/0081329 A1* | 4/2010 | Fan | | 439/626 |
| 2010/0184334 A1* | 7/2010 | Ma | | 439/626 |
| 2010/0216322 A1* | 8/2010 | Fan | | 439/83 |
| 2010/0216344 A1* | 8/2010 | Fan | | 439/626 |
| 2010/0227507 A1* | 9/2010 | Cheng et al. | | 439/626 |
| 2010/0267257 A1* | 10/2010 | Yeh et al. | | 439/83 |
| 2010/0291774 A1* | 11/2010 | Cheng et al. | | 439/66 |
| 2010/0291775 A1* | 11/2010 | Szu | | 439/70 |
| 2011/0008979 A1* | 1/2011 | Yeh et al. | | 439/83 |
| 2011/0014823 A1* | 1/2011 | Lin | | 439/786 |
| 2011/0111607 A1* | 5/2011 | Chang et al. | | 439/70 |
| 2011/0111638 A1* | 5/2011 | Cheng | | 439/660 |
| 2011/0159734 A1* | 6/2011 | Ju | | 439/607.05 |
| 2011/0223781 A1* | 9/2011 | Ho | | 439/70 |
| 2011/0256771 A1* | 10/2011 | Jin | | 439/626 |
| 2011/0269344 A1* | 11/2011 | Lin et al. | | 439/626 |
| 2011/0318966 A1* | 12/2011 | Huo et al. | | 439/626 |
| 2012/0028502 A1* | 2/2012 | Yeh et al. | | 439/626 |
| 2012/0149249 A1* | 6/2012 | Ihara | | 439/660 |
| 2012/0171897 A1* | 7/2012 | Ju et al. | | 439/607.01 |
| 2012/0178298 A1* | 7/2012 | Jin | | 439/626 |
| 2012/0178306 A1* | 7/2012 | Ju | | 439/660 |
| 2012/0196481 A1* | 8/2012 | Ju | | 439/626 |
| 2012/0225586 A1* | 9/2012 | Tsai et al. | | 439/626 |
| 2013/0183861 A1* | 7/2013 | Chang et al. | | 439/607.35 |
| 2013/0237090 A1* | 9/2013 | Chang et al. | | 439/607.01 |
| 2013/0237091 A1* | 9/2013 | Mason | | 439/607.05 |
| 2013/0267124 A1* | 10/2013 | Chang et al. | | 439/630 |
| 2013/0273779 A1* | 10/2013 | Liu et al. | | 439/626 |
| 2013/0330969 A1* | 12/2013 | Avery et al. | | 439/607.01 |
| 2014/0030925 A1* | 1/2014 | Terhune, IV | | 439/626 |
| 2014/0038438 A1* | 2/2014 | Chang et al. | | 439/76.1 |
| 2014/0038465 A1* | 2/2014 | Chang et al. | | 439/626 |
| 2014/0080327 A1* | 3/2014 | Hwang et al. | | 439/65 |

* cited by examiner

SHIELDING SOCKET WITH TWO PIECES HOUSING COMPONENTS

BACKGROUND OF THE INVENTION

1. Field of the Invention

The present invention relates to an electrical connector, and more particularly to an electrical connector mounted to a printed circuit board for receiving an Integrated Circuit package.

2. Description of the Prior Art

As the "Nonlinear Analysis Helps Design LGA Connectors" (Connector Specifier, February 2001) show, an electrical connector includes a base and a number of contacts assembled in the base. An upper contacting points of the terminals contact with a CPU and a lower contacting points of the terminals contact with a printed circuit board, and formed the signal transmission between the CPU and the printed circuit board. With the development of the electronic technology, the size of the electrical connector becomes smaller and smaller, and the density of the pads of the CPU and the printed circuit board becomes more dense and dense. So, the electromagnetic interference between the adjacent contacts become serious and it affects the quality of the signal transmission between the CPU and the printed circuit board.

An electrical connector electrically connecting a chip module to a printed circuit board is described in Tai Wan Patent No. 419,248, issued to CHANG on Dec. 21, 2011. The electrical connector includes a socket body with a plurality of electrical contacts secured therein. The socket body has a top surface, a low surface opposite to the top surface and a number of grooves penetrate from the top surface to the low surface. Each of the grooves includes a first groove and a second groove. The contacts secured in the first grooves respectively. The electrical connector further includes a metal shielding plate assembled in the second groove. Due to the metal shielding plate is inserted between the contacts, and a space between the contacts is small, so, it is hard to produce the socket body.

Therefore, it is needed to find a new electrical socket to overcome the problems mentioned above.

SUMMARY OF THE INVENTION

Accordingly, an object of the present invention is to provide an electrical connector getting better shielding result.

In order to achieve the object set forth, an electrical connector electrically connecting a chip module to a printed circuit board, the electrical connector comprises an insulative housing and a plurality of terminals received therein. The insulative housing comprises a lower component and an upper component matched with the lower component. The lower component comprises a boss and the upper component comprises a matching hole matched with the boss, the boss and the matching hole contacts the contacting area of the boss and the matching hole are plated with metal layer.

DESCRIPTION OF PREFERRED EMBODIMENT

Figure 1:
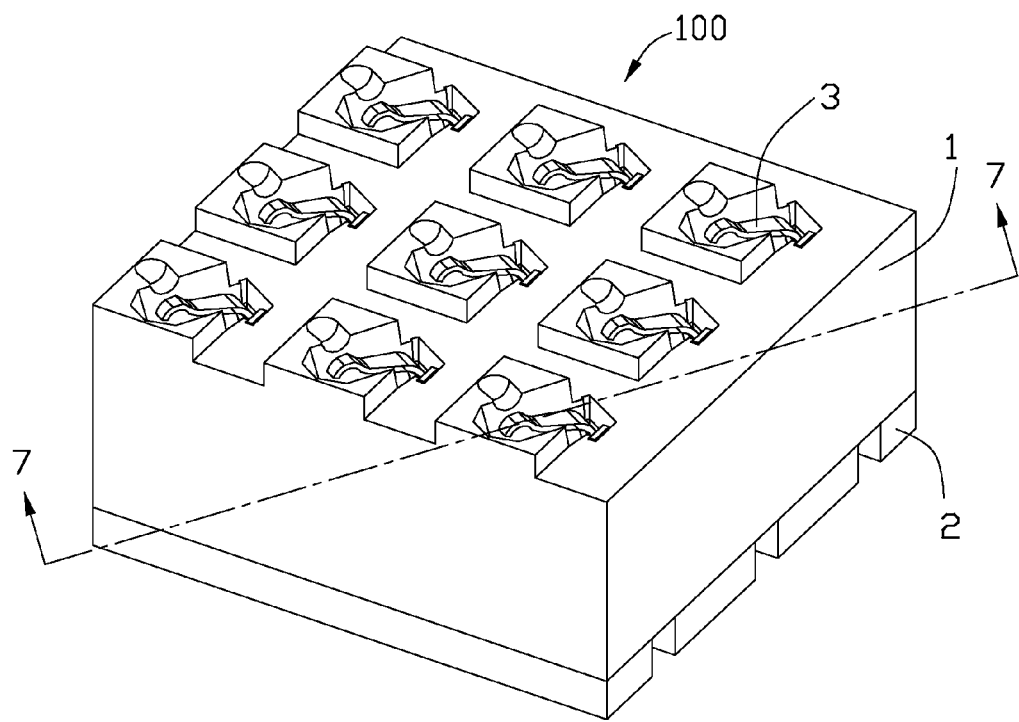
FIG. 1 is an isometric, assembled view of an electrical connector in accordance with a preferred embodiment of the present invention.
Figure 2:
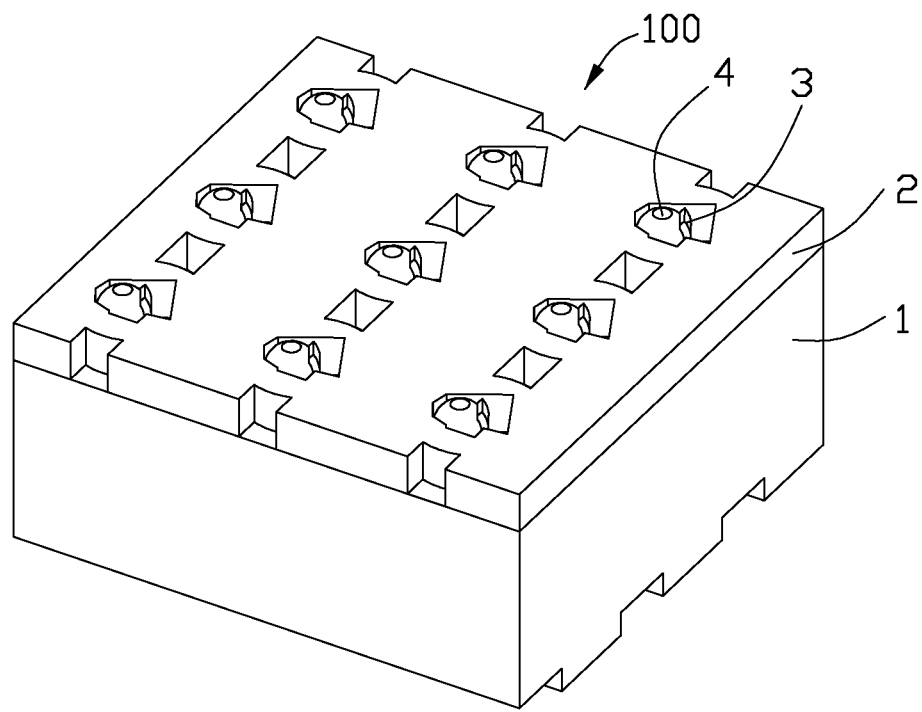
FIG. 2 is another isometric, assembled view of the electrical connector as shown in FIG. 1.

Reference will now be made to the drawings to describe the present invention in detail.

Referring to FIGS. 1-7, an electrical connector 100 according to the present invention is used to electrically connecting a chip module (not show) to a printed circuit board (not show). The electrical connector 100 comprises an insulative housing, a plurality of terminals 3 received therein and a plurality of solder balls 4 soldered to the printed circuit board. The insulative housing comprises a lower component or a secondary housing 2, and an upper component or a primary housing 1 stacked on the lower component 2.

Figure 3:
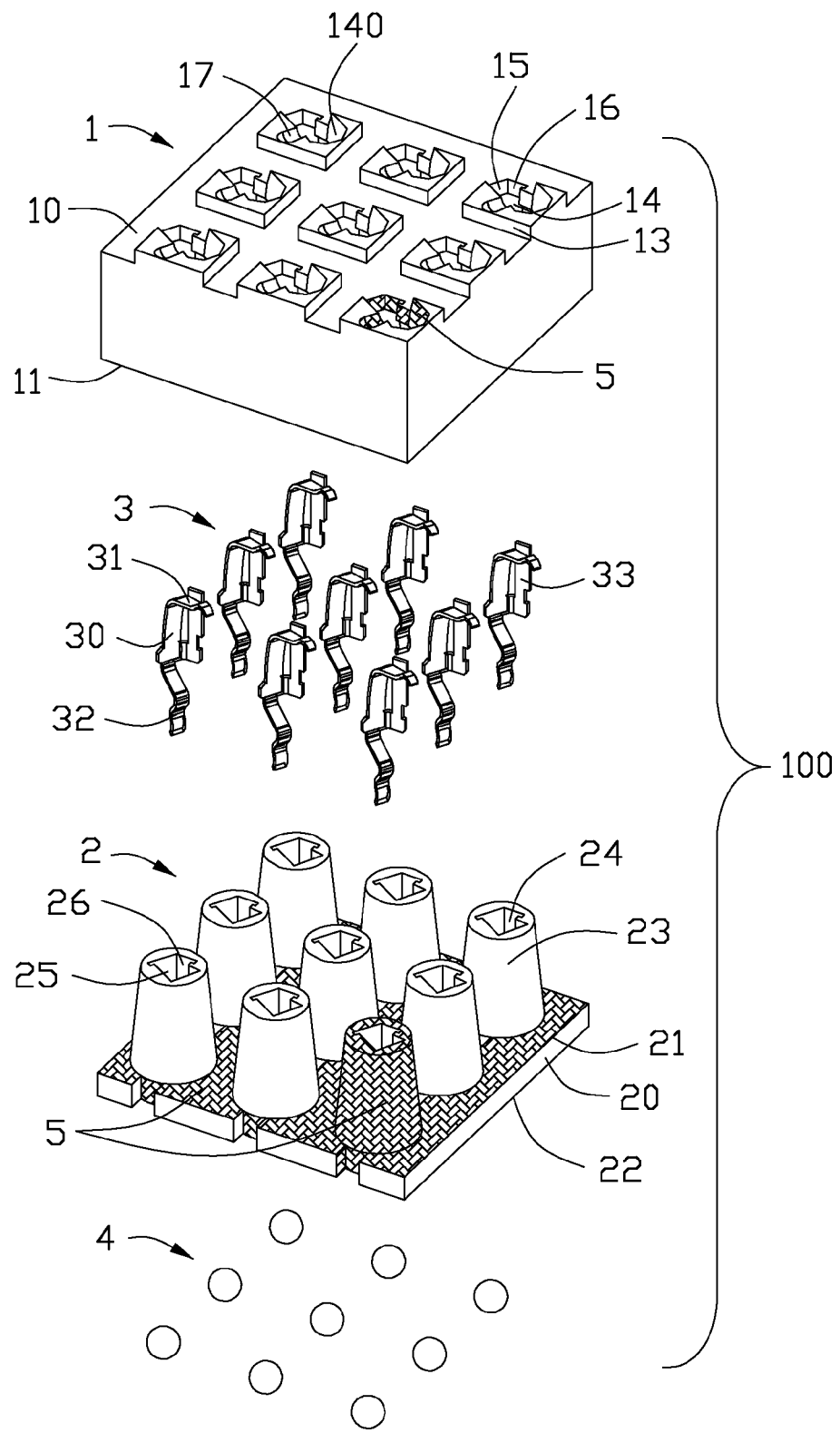
FIG. 3 is an exploded view of the electrical connector shown in FIG. 1.
Figure 4:
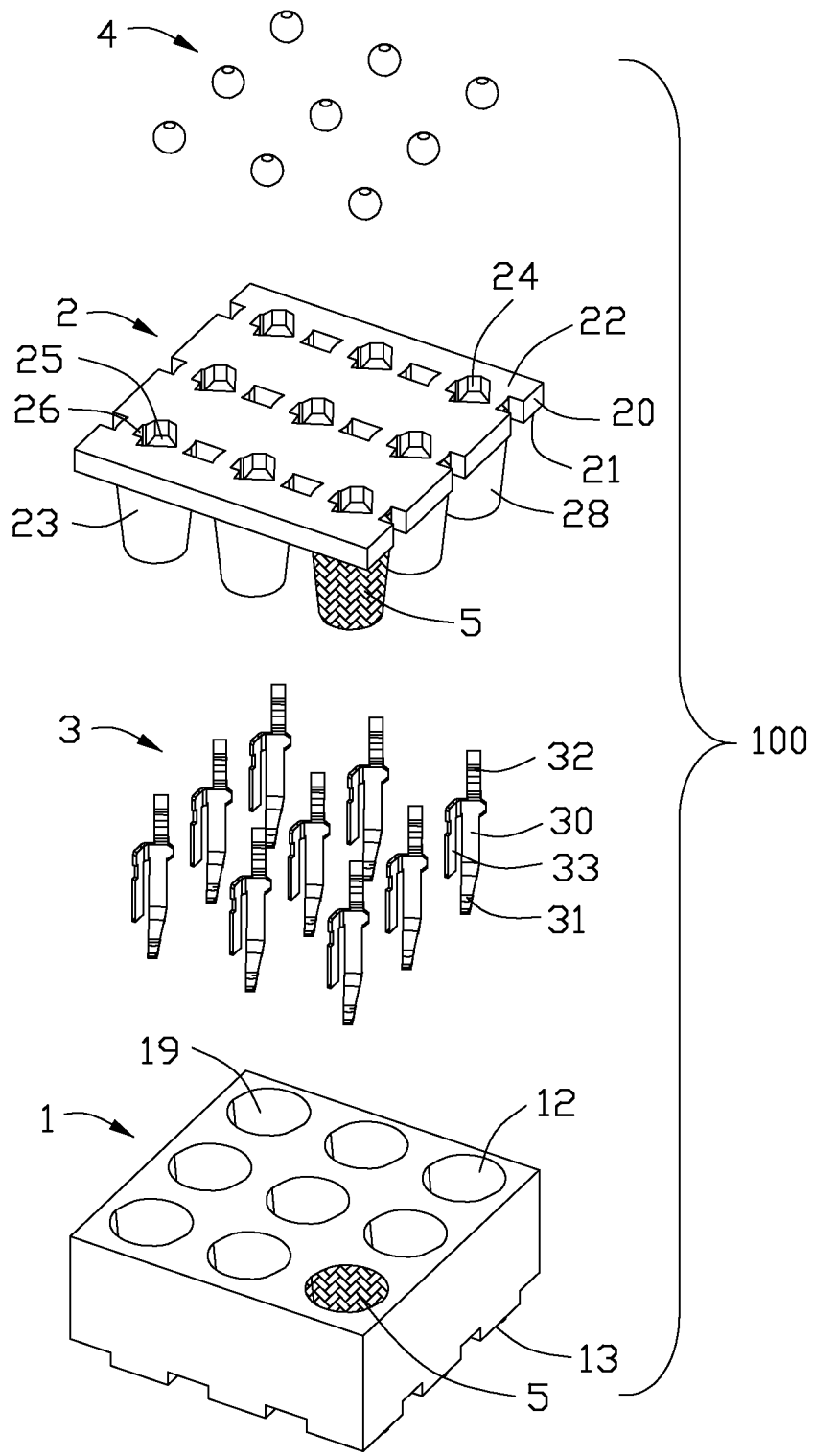
FIG. 4 is another exploded view of the electrical connector shown in FIG. 1.
Figure 5:
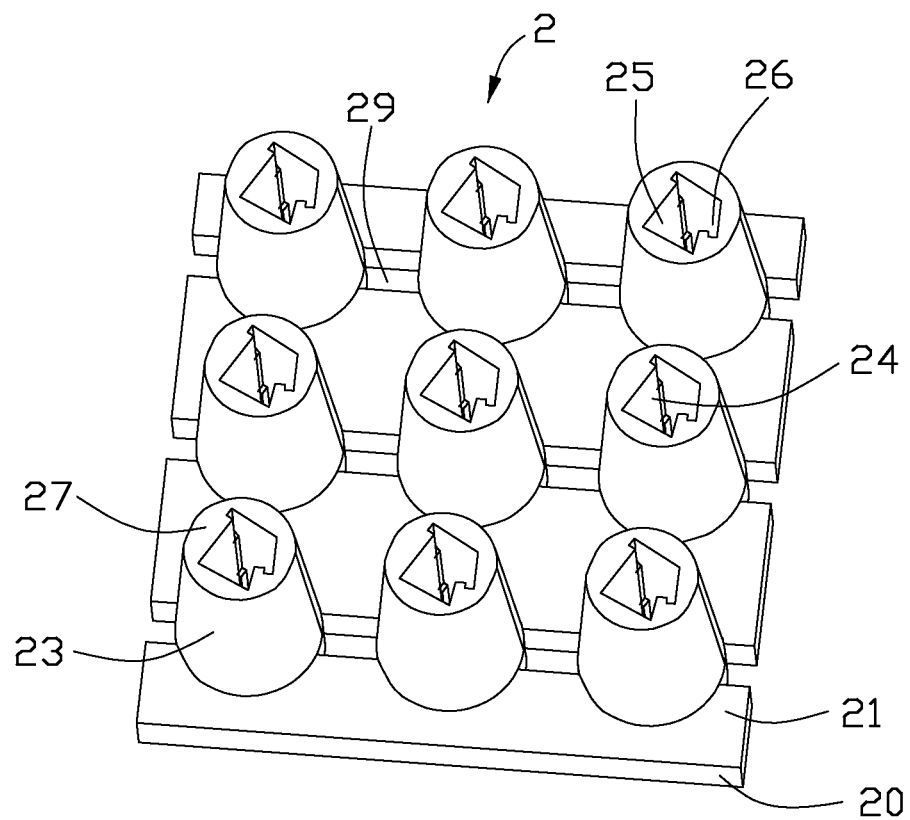
FIG. 5 is an isometric view of the lower component of the electrical connector show in FIG. 3.
Figure 6:
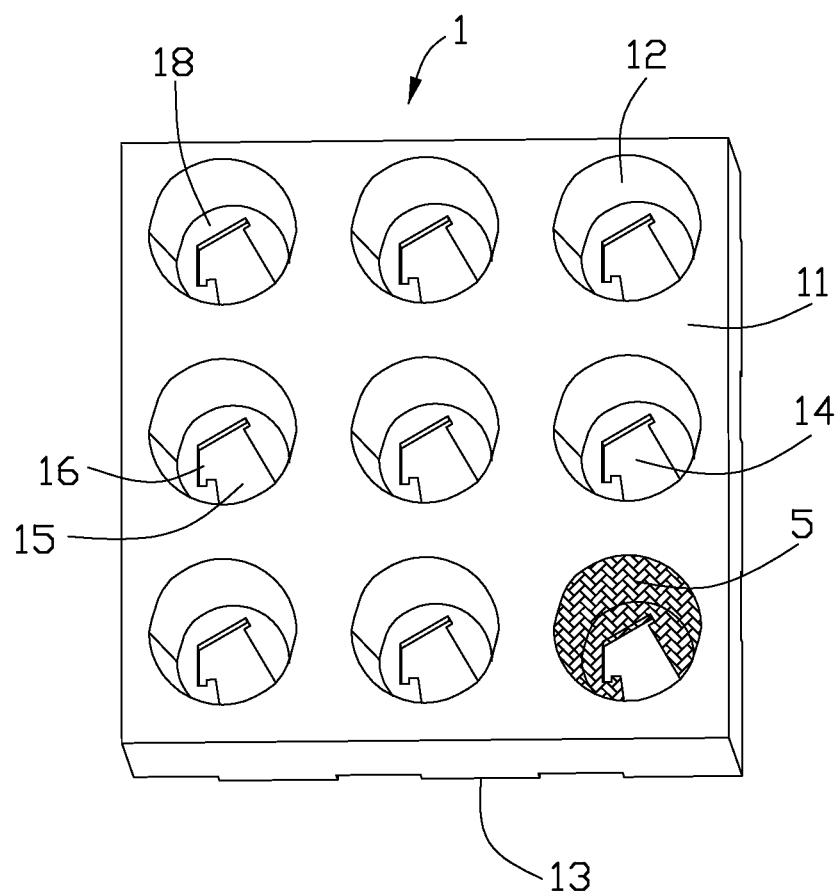
FIG. 6 is an isometric view of the upper component of the electrical connector show in FIG. 3.
Figure 7:
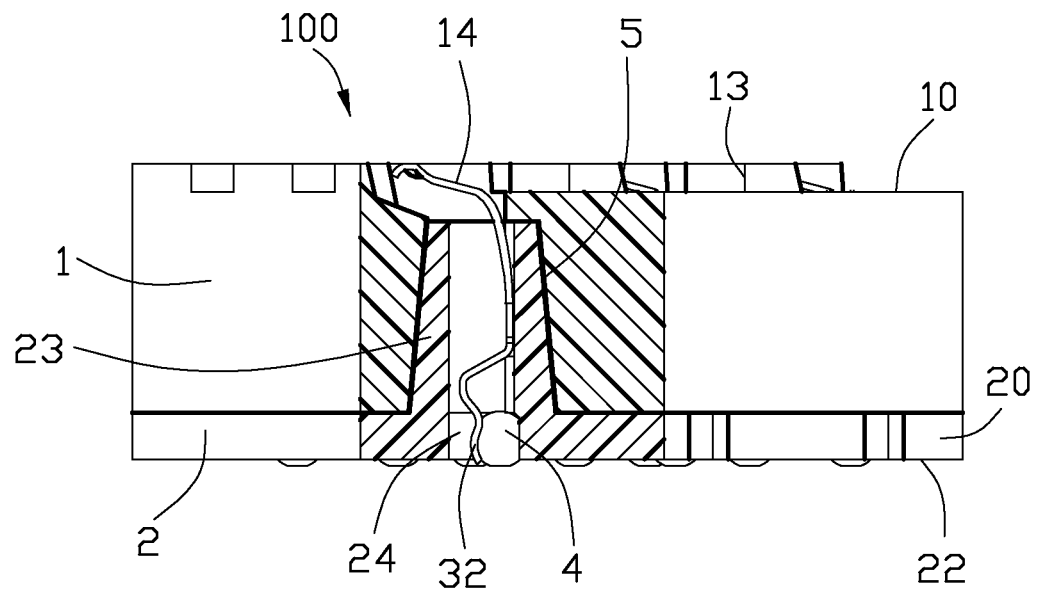
FIG. 7 is a cross-sectional view of the electrical connector taken along line 7-7 in FIG. 1.

Referring to FIGS. 3 and 5-6, the upper component 1 comprises a top surface 10 and a bottom surface 11 opposite to the top surface 10. The bottom surface 11 depresses to form a plurality of matching holes 12. Each of the matching holes 12 is configured to a taper shape and the diameter of the matching hole 12 becomes smaller and smaller from bottom to top. The top surface 10 projects upwardly to form a plurality of tabs 13, and each of the tabs 13 has a storage hole 14 running through a receiving surface of the tab 13 and communicating with the mating hole 12 of the bottom surface 11. The storage hole 14 comprises a receiving hole 15 and a retention hole 16 communicating with the receiving hole 15. The upper component 1 further defines a plurality of recesses 17 depressing downwardly from the receiving surface and communicating with the storage hole 14. The adjacent tabs 13 are spaced and arranged in a matrix. The storage hole 14 has a plurality of sidewalls 140, the sidewalls 140 and the recesses 17 are both plated with a metal layer 5.

The lower component 2 comprises a body portion 20 with rectangle shape. The lower component 2 has an upper surface 21, a lower surface 22 opposite to the upper surface 21 and a plurality of bosses 23 projecting upwardly from the upper surface 21. Each of the bosses 23 is configured to a taper shape and the diameter of the boss becomes smaller and smaller from bottom to top. The lower component 2 further employs a storage groove 24 penetrated a surface of the boss 23 and the lower surface 22 of the lower component 2. The storage hole 24 comprises a receiving groove 25 and a retention groove 26 communicated with each other. The boss 23 also comprises a bottom receiving surface 27 parallel to the upper surface 21 and the diameter of the boss 23 becomes smaller and smaller from the upper surface 21 to the bottom receiving surface 27. The bosses 23 are spaced and arranged in a matrix. The body portion 20 has a slot 29 with inner sidewalls between the spaced areas of the adjacent bosses 23 in a transverse direction. Both of the upper surface 21 and the inner sidewalls are plated with metal layer 5. The matching hole 12 is communicated with the storage hole 14 and they penetrate from the receiving surface to the bottom surface 11.

Referring to FIG. 3, each of the terminals 3 comprises a base 30, a spring beam or mating arm 31 bending upwardly from the base 30, a soldering or connecting portion 32 bending downwardly from the base 30 and a retention portion 33 bending outwardly from one side of the base 30. Both of the base 30 and the soldering portion 32 are received in the receiving groove 25 and the spring beam 31 is received in the receiving hole 15. The retention portion 33 is received in both of the retention groove 26 and the retention hole 16.

After the electrical connector 100 is assembled, the boss 23 is received in the matching hole 12 of the upper component 1. The boss 23 has an outer wall 28 and the matching hole 12 has an inner wall 19. Both of the outer wall 28 and the inner wall 19 are plated with metal layer 5 and the boss 23 electrically connects to the matching hole 12 tightly by the metal layer 5. The bottom receiving surface 27 of the boss 23 is plated with metal layer 5. The matching hole 12 of the upper component 1 has a top receiving surface 18 contacting with the bottom receiving surface 27 of the lower component 2 and the top receiving surface 18 is plated with metal layer 5. The top receiving surface 18 contacts with the bottom receiving surface 27 tightly that it can save the space of the electrical connector 100 and convenient to assemble. The sidewalls 140 locate at the tab 13 and it can shield the electromagnetic interference of the spring beam 31.

The contacting area of the boss 23 and the matching hole 12 is plated with metal layer 5, the sidewalls 140 of the receiving hole 15 are plated with metal layer 5, the top receiving surface 18 is plated with metal layer 5, both of the upper surface 21 and the inner sidewalls of the slot 29 are plated with metal layer 5. So the contact 5 is surrounded by the metal layer 5 and it can protect the signal transmit from being electromagnetic interference between the chip module and the printed circuit board, so as to get better shielding effects.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector electrically connecting a chip module to a printed circuit board, and comprising:
    an insulative housing comprises a lower component and an upper component stacked with the lower component;
    a plurality of terminals retained in the lower component of the insulative housing; and wherein
    the lower component defines a boss and the upper component has a matching hole receiving the boss of the lower component, the boss contacts with the matching hole and it forms a contacting area, the contacting area of the boss and the matching hole are plated with a metal layer.

2. The electrical connector as claimed in claim 1, wherein said boss comprises an outer wall and the matching hole has an inner wall, wherein the metal layer is plated to the outer wall and the inner wall, the boss and the matching hole electrically contacts each other by the metal layer.

3. The electrical connector as claimed in claim 2, wherein said matching hole of the upper component has a top receiving surface and the boss of the lower component has a bottom receiving surface, wherein both of the top receiving surface and the bottom surface are plated with metal layer and they contact with each other.

4. The electrical connector as claimed in claim 1, wherein said upper component has a top surface and a bottom surface opposite to the top surface, wherein the matching hole is depressed from the bottom surface.

5. The electrical connector as claimed in claim 4, wherein said upper component further defines a tab projecting from the top surface and the tab has a storage hole running through the matching hole.

6. The electrical connector as claimed in claim 1, wherein said lower component has an upper surface and a lower surface opposite to the upper surface, wherein the boss is extended upwardly from the upper surface.

7. The electrical connector as claimed in claim 6, wherein said lower component also comprises a storage groove penetrating the boss and connecting with the lower surface.

8. The electrical connector as claimed in claim 7, wherein said contact is assembled in both of the storage hole and the storage groove, wherein the contact comprises a base, a spring beam extending upwardly from the base, a soldering portion extending downwardly from the base and a retention portion bending from one side of the base.

9. The electrical connector as claimed in claim 8, wherein said storage hole comprises a receiving hole that the spring beam received therein and a retention hole that the retention portion received therein, wherein said storage groove comprises a receiving groove that the base received therein and a retention groove that the retention portion received therein.

10. The electrical connector as claimed in claim 9, wherein said sidewalls locate at the tab and it can shield the electromagnetic interference of the spring beam.

11. The electrical connector as claimed in claim 1, wherein said boss is configured with a taper shape and the diameter of the boss becomes smaller and smaller from bottom to top.

12. The electrical connector as claimed in claim 11, wherein the shape of the matching hole is corresponding to the boss and the diameter of the matching hole becomes smaller and smaller from bottom to top.

13. An electrical connector connecting with a chip module to a printed circuit board, and comprising:
    an insulative housing comprises a lower component with a plurality of bosses, an upper component with a plurality of matching holes and the bosses received in the matching holes, so the upper component stacked on the lower component, and wherein
    at least one of the bosses defines a circular cone type with smaller and smaller from a connecting portion connected with the lower component to a end of the circular cone type; and
    an outside of the circular cone type and an inside of the matching hole all define a metal layer for shielding the electrical connector.

14. The electrical connector as claimed in claim 13, wherein the shape of the matching hole is corresponding to the shape of the circular cone type and they electrically contacting tightly.

15. The electrical connector as claimed in claim 13, wherein the electrical connector further comprises at least a terminal comprising a spring beam and a soldering portion extending opposite to the spring beam, the terminal electrically connecting the chip module to the printed circuit board that forms an upper contacting point and a lower contacting point and it can shield the electromagnetic interference from the upper contacting point to the lower contacting point.

16. An electrical connector comprising:
    an insulative primary housing defining a horizontal body portion with a plurality of bosses extending upwardly from the body portion in matrix, a plurality of storage grooves formed in the corresponding bosses, respectively, each of said storage grooves extending through the corresponding boss and the body portion thereunder; and
    a plurality of terminals disposed in the corresponding storage groove, each of said terminals defining a lower connecting portion and an upper resilient mating arm respectively located around an upper end of the corresponding boss and a bottom surface of the body portion; wherein a metallic coating is applied upon an exterior surface of each of said bosses for shielding the corresponding terminal inside said boss.

17. The electrical connector as claimed in claim 16, wherein said metallic coating reaches the upper end of the corresponding boss upwardly and the bottom surface of the body portion downwardly.

18. The electrical connector as claimed in claim 17, wherein said body portion defines a plurality of grooves each communicating with the exterior surface of the corresponding boss and equipped with the metallic coating thereon so as to have said metallic coating reach the bottom surface of the body portion.

19. The electrical connector as claimed 16, further including an insulative secondary housing located upon the primary housing with therein a plurality of matching holes receiving the corresponding bosses, respectively; wherein the upper resilient mating arms of the terminals extend upwardly beyond the second housing.

20. The electrical connector as claimed in claim 19, wherein an interior surface of each of said matching holes is applied with said metallic coating thereon for coupling with the exterior surface of the corresponding boss which is also equipped with the metallic coating.

\* \* \* \* \*